(12) United States Patent
Shim (10) Patent No.: US 7,659,761 B2
(45) Date of Patent: Feb. 9, 2010

(54) OPERATION MODE SETTING APPARATUS, SEMICONDUCTOR INTEGRATED CIRCUIT INCLUDING THE SAME, AND METHOD OF CONTROLLING SEMICONDUCTOR INTEGRATED CIRCUIT

(75) Inventor: Seok-Bo Shim, Ichon (KR)

(73) Assignee: Hynix Semiconductor Inc. (KR)

( * ) Notice: Subject to any disclaimer, the term of this patent is extended or adjusted under 35 U.S.C. 154(b) by 55 days.

(21) Appl. No.: 11/961,949

(22) Filed: Dec. 20, 2007

(65) Prior Publication Data

US 2008/0297211 A1 Dec. 4, 2008

(30) Foreign Application Priority Data

May 31, 2007 (KR) .................. 10-2007-0053061

(51) Int. Cl.
*H03L 7/06* (2006.01)
(52) U.S. Cl. .................. 327/158; 327/149; 327/161; 327/142
(58) Field of Classification Search ............. 331/15–17; 375/373–376; 327/141–163
See application file for complete search history.

(56) References Cited

U.S. PATENT DOCUMENTS

| 6,137,328 | A | 10/2000 | Sung |
| 6,445,234 | B1 | 9/2002 | Yoon et al. |
| 6,839,301 | B2 | 1/2005 | Lin et al. |
| 7,098,712 | B2 | 8/2006 | Lee |
| 2007/0007941 | A1 | 1/2007 | Lin et al. |
| 2007/0069776 | A1* | 3/2007 | Hur ........................... 327/158 |

FOREIGN PATENT DOCUMENTS

| JP | 2004362757 | 12/2004 |
| KR | 10-1998-0086687 | 12/1998 |
| KR | 1020050013737 A | 2/2005 |
| KR | 100551475 B1 | 2/2006 |

OTHER PUBLICATIONS

US 7,161,399, 01/2007, Lin (withdrawn)

* cited by examiner

*Primary Examiner*—Lincoln Donovan
*Assistant Examiner*—Brandon S Cole
(74) *Attorney, Agent, or Firm*—Baker & McKenzie LLP (57) ABSTRACT

An operation mode setting apparatus includes an operation mode setting control unit that discriminates the phase of a reference clock from the phase of a feedback clock and generates a locking suspension signal, and an operation mode setting unit that generates a locking completion signal in response to a pulse signal and a phase comparison signal under the control of a reset signal and the locking suspension signal.

21 Claims, 4 Drawing Sheets

FIG.4 ions> # OPERATION MODE SETTING APPARATUS, SEMICONDUCTOR INTEGRATED CIRCUIT INCLUDING THE SAME, AND METHOD OF CONTROLLING SEMICONDUCTOR INTEGRATED CIRCUIT

CROSS-REFERENCE TO RELATED PATENT APPLICATION

This application claims the benefit under 35 U.S.C. 119(a) of Korean Patent Application No. 10-2007-0053061, filed on May 31, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly, to apparatus and methods for setting a mode in a semiconductor integrated circuit to adapt to errors.

2. Related Art

A DLL (delay locked loop) circuit provided in a conventional semiconductor integrated circuit is used to provide an internal clock having a phase that leads the phase of a reference clock obtained by buffering an external clock by a predetermined amount of time. When an internal clock used in the semiconductor integrated circuit is delayed by a clock buffer and a transmission line, a phase difference between the external clock and the internal clock occurs, which increases the data access time. The DLL circuit is used to solve this problem. The DLL circuit controls the phase of the internal clock to lead the phase of the external clock by a predetermined amount of time, in order to widen the effective data output period.

A conventional DLL circuit includes a replica delay for modeling the output delay of an internal reference clock, thereby generating a feedback clock. The DLL circuit compares the phase of the reference clock with the phase of the feedback clock, and generates a signal based on the result of the comparison. A delay line gives the reference clock a predetermined delay time to synchronize the phase of the reference clock with the phase of the feedback clock.

In this case, for example, a coarse locking mode or a fine locking mode is used as a method of giving the reference clock a delay time and locking the clock. In the coarse locking mode, the delay time is given by each of the unit delays provided in the delay line. In the fine locking mode, a phase mixer, not the unit delay, is used to delay the clock by a minute amount of time. The DLL circuit includes an operation mode setting apparatus in order to perform these operations. The operation mode setting apparatus receives a phase comparison signal from a phase comparator that compares the phase of the reference clock with the phase of the feedback clock, and outputs a locking completion signal for indicating the end timing of the coarse locking mode, thereby controlling an operation mode of the delay line.

The operation mode setting apparatus initializes the locking completion signal in response to a reset signal. Then, a latch circuit in the operation mode setting apparatus maintains the level of the locking completion signal that is generated in response to the phase comparison signal. Only when the reset signal is enabled, can the locking completion signal be initialized. However, the reset signal is enabled only when the DLL circuit is at an initial stage. Therefore, the state of the locking completion signal cannot be changed after it is initialized.

Actually, the toggle timing of the clock input to the DLL circuit may vary due to various factors, such as external jitter. In addition, the phase difference between the internal reference clock and the feedback clock may not decrease in the DLL circuit due to variations in PVT (process, voltage, and temperature). In this case, the DLL circuit needs to reset the delay value given to the delay line, thereby controlling the phase of the internal clock. However, since the level of the locking completion signal is maintained after the locking completion signal is enabled; it is difficult to perform the coarse locking mode again. Accordingly, the DLL circuit can perform only the fine locking mode to control the phase of the internal clock. If the phase difference between the reference clock and the feedback clock increases, it requires a lot of time to match the phases of the clock signals through the fine locking mode. In this case, a state of the duty ratio of the clock is worse, which may lead to errors in the output data.

As described above, in a conventional operation mode setting apparatus, the DLL circuit has been designed without considering the effect of external jitter or variations in PVT. Therefore, a conventional operation mode setting apparatus has problems in that it can be initialized only at the beginning of the operation of the DLL circuit and it does not support the operation mode when the operation of the DLL circuit needs to be reset due to a variation in the state of the clock. That is, a conventional operation mode setting apparatus has low adaptability to errors, such as the variation in the state of the clock, and the errors may affect the delay locking operation of the DLL circuit and the data output operation of the semiconductor integrated circuit.

SUMMARY

An operation mode setting apparatus capable of adapting to errors caused by a variation in the state of a clock, a semiconductor integrated circuit including the same, and a method of controlling the semiconductor integrated circuit are disclosed herein.

According to one aspect, an operation mode setting apparatus includes an operation mode setting control unit that discriminates the phase of a reference clock from the phase of a feedback clock to generate a locking suspension signal, and an operation mode setting unit that generates a locking completion signal in response to a phase comparison signal and a pulse signal under the control of a reset signal and the locking suspension signal.

According to another aspect, a semiconductor integrated circuit includes a DLL circuit that delays a reference clock in response to a locking completion signal to generate a delay clock and a feedback clock, and generates the locking completion signal in response to the reference clock and the feedback clock, and a DLL control unit that discriminates the phase of the reference clock from the phase of the feedback clock to control the operation mode of the DLL circuit.

According to still another aspect, there is provided a method of controlling a semiconductor integrated circuit. The method includes disabling a locking completion signal to perform a coarse locking operation on a reference clock, thereby generating a delay clock and a feedback clock enabling the locking completion signal to perform a fine locking operation on the reference clock, thereby generating the delay clock and the feedback clock and discriminating the phase of the reference clock from the phase of the feedback clock and re-determining whether to enable the locking completion signal on the basis of the result of the discrimination.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
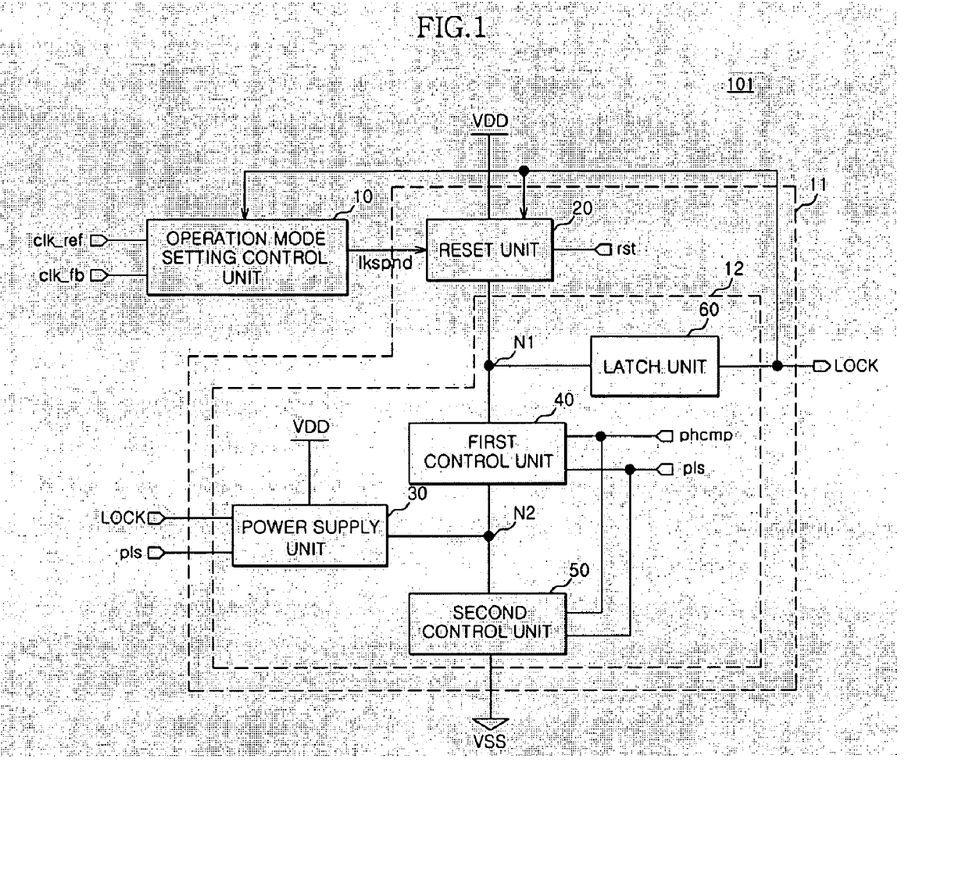
FIG. 1 is a block diagram illustrating an operation mode setting apparatus according to an embodiment.

FIG. 1 is a diagram illustrating an operation mode setting apparatus 101 according to one embodiment. Referring to FIG. 1, it can be seen that the operation mode setting apparatus 101 includes an operation mode setting control unit 10, a reset unit 20, a power supply unit 30, a first control unit 40, a second control unit 50, and a latch unit 60.

In this structure, the reset unit 20, the power supply unit 30, the first control unit 40, the second control unit 50 and the latch unit 60 can be called to an operation mode setting unit 11. The power supply unit 30, the first control unit 40, the second control unit 50, and the latch unit 60 can be called to a locking completion signal generating unit 12.

The operation mode setting control unit 10 can be configured to discriminate the phase of a reference clock 'clk_ref' from the phase of a feedback clock 'clk_fb' in response to a locking completion signal ' ' to generate a locking suspension signal 'lkspnd'. The reset unit 20 can be configured to control the voltage level of a first node N1 in response to the locking suspension signal 'lkspnd', a reset signal 'rst', and the locking completion signal 'LOCK'. The power supply unit 30 can be configured to supply voltage to a second node N2 in response to the locking completion signal 'LOCK' and a pulse signal 'pls'. The first control unit 40 can be configured to control the voltage level of the first node N1 in response to a phase comparison signal 'phcmp' and the pulse signal 'pls'. The second control unit 50 controls the voltage level of the second node N2 in response to the phase comparison signal 'phcmp' and the pulse signal 'pls'. The latch unit 60 can be configured to latch the voltage applied at the first node N1, and output the locking completion signal 'LOCK'.

The first node N1 is supplied with a voltage in order to generate the locking completion signal 'LOCK'. Initially, the locking completion signal 'LOCK' is disabled and the operation mode setting control unit 10 enables the locking suspension signal 'lkspnd'. When the reset signal 'rst' is enabled, the reset unit 20 supplies voltage to the first node N1.

After the locking completion signal 'LOCK' is enabled, the operation mode setting control unit 10 enables the locking suspension signal 'lkspnd' when the phase difference between the reference clock 'clk_ref' and the feedback clock 'clk_fb' is equal to or larger than a predetermined value. In this case, the reset unit 20 supplies voltage to the first node N1 in response to the locking suspension signal 'lkspnd'.

In certain embodiments, the reset signal 'rst' and the locking suspension signal 'lkspnd' may be implemented as low enable signals.

That is, at the beginning of the operation of the operation mode setting apparatus where the locking completion signal 'LOCK' is disabled, the reset unit 20 supplies voltage to the first node N1 in response to the reset signal 'rst'. After the locking completion signal 'LOCK' is enabled, the reset unit 20 supplies voltage to the first node N1 in response to the locking suspension signal 'lkspnd' that is generated according to the phase difference between the reference clock 'clk_ref' and the feedback clock 'clk_fb'. Therefore, even when the reset signal 'rst' is not enabled, the operation mode setting apparatus can reset the state of the locking completion signal 'LOCK'.

Therefore, if the locking completion signal 'LOCK' is enabled and then an error occurs resulting in a mismatch between the phase of the reference clock 'clk_ref' and the phase of the feedback clock 'clk_fb', then the operation mode setting apparatus can disable the locking completion signal 'LOCK', and thus the DLL circuit can resume a coarse locking mode. Accordingly, it is possible to rapidly correct errors occurring in the internal clock of the DLL circuit.

Meanwhile, the pulse signal 'pls' is generated by a pulse generator supporting the DLL circuit. The pulse signal 'pls' generally has a pulse width corresponding to one period of the internal clock, and is toggled for every predetermined period of the internal clock, for example, for every 15 periods.

Figure 2:
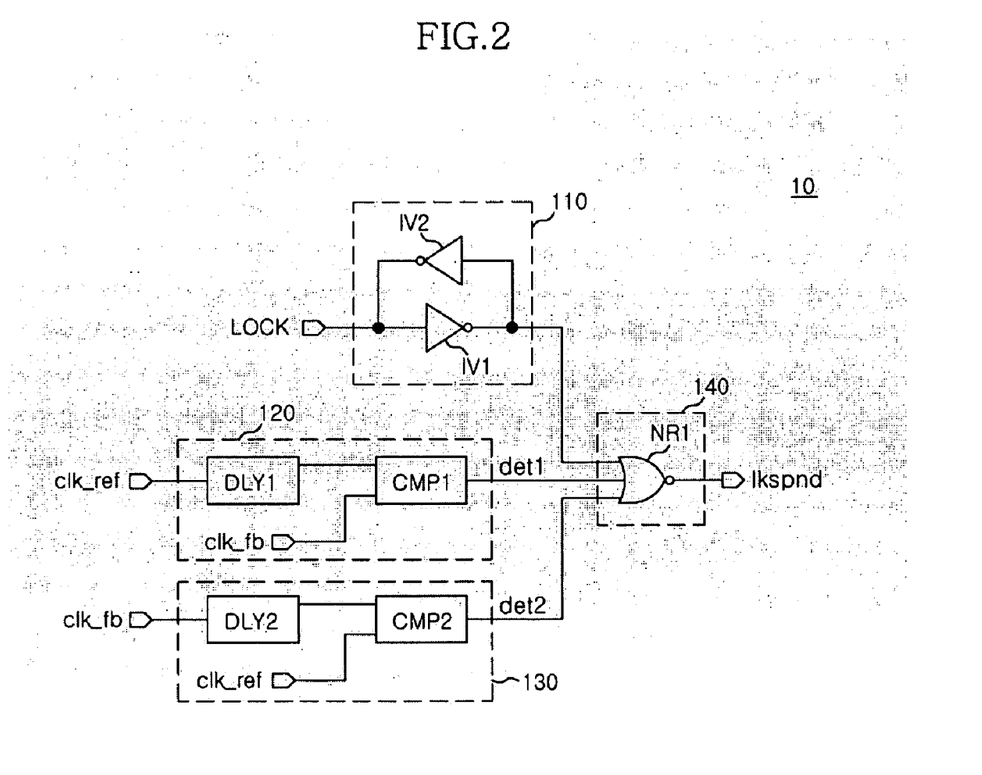
FIG. 2 is a schematic diagram showing the detailed configuration of an operation mode setting control unit that can be included in the apparatus shown in FIG. 1.

FIG. 2 is a schematic diagram illustrating the operation mode control unit 10 in detail. Referring to FIG. 2, the operation mode setting control unit 10 can include a latch 110, a first detector 120, a second detector 130, and a signal combining unit 140. The latch 110 can be configured to latch the locking completion signal 'LOCK'. The latch 110 can include first and second inverters IV1 and IV2 forming a latch structure for the locking completion signal 'LOCK'.

The first detector 120 can be configured to detect whether the phase of the feedback clock 'clk_fb' leads the phase of the reference clock 'clk_ref' by a first time, thereby generating a first detection signal 'det1'. The first detector 120 can include a first delay DLY1 that delays the reference clock 'clk_ref' by the first time, and a first phase comparator CMP1 that compares the phase of the feedback clock 'clk_fb' with the phase of an output signal of the first delay DLY1 and generates the first detection signal 'det1'.

The second detector 130 can be configured to detect whether the phase of the reference clock 'clk_ref' leads the phase of the feedback clock 'clk_fb' by a second time, thereby generating a second detection signal 'det2'. The second detector 130 can include a second delay DLY2 that delays the feedback clock 'clk_fb' by the second time, and a second phase comparator CMP2 that compares the phase of the reference clock 'clk_ref' with the phase of an output signal of the second delay DLY2 and generates the second detection signal 'det2'.

The signal combining unit 140 can be configured to combine an output signal of the latch 110, the first detection signal 'det1', and the second detection signal 'det2' to generate the locking suspension signal 'lkspnd'. In order to perform the combining operation, the signal combining unit 140 can include a first NOR gate NR1.

The first time and the second time define an error range based in the requirements of a particular embodiment. For example, when the phase of the feedback clock 'clk_fb' leads the phase of the reference clock 'clk_ref' by the first time, the first detector 120 can be configured to enable the first detection signal 'det1'. That is, this situation is defined as an error. On the other hand, when the phase of the reference clock 'clk_ref' leads the phase of the feedback clock 'clk_fb' by the second time, the second detector 130 can be configured to enable the second detection signal 'det2'. That is, this situation also is defined as an error. Sufficiently wide error ranges of the reference clock 'clk_ref' and the feedback clock 'clk_fb' should be determined so that the system will not perform the coarse locking mode too often It should also be noted that the first time and the second time can be equal to each other.

When at least one of the output signals of the latch 110, i.e., the first detection signal 'det1' or the second detection signal 'det2', is at a high level, the signal combining unit 140 can be configured to enable the locking suspension signal 'lkspnd'. Therefore, when the locking completion signal 'LOCK' is disabled, the locking suspension signal 'lkspnd' is enabled regardless of the first and second detection signals 'det1' and 'det2'. When the locking completion signal 'LOCK' is enabled and then one of the first and second detection signals 'det1' and 'det2' is enabled, the locking suspension signal 'lkspnd' is enabled. That is, the first and second detection signals 'det1' and 'det2' are used to generate the locking suspension signal 'lkspnd' after the locking completion signal 'LOCK' is enabled. Therefore, after the locking completion signal is lock is enabled, it is possible to change the state of the locking suspension signal 'lkspnd'.

Figure 3:
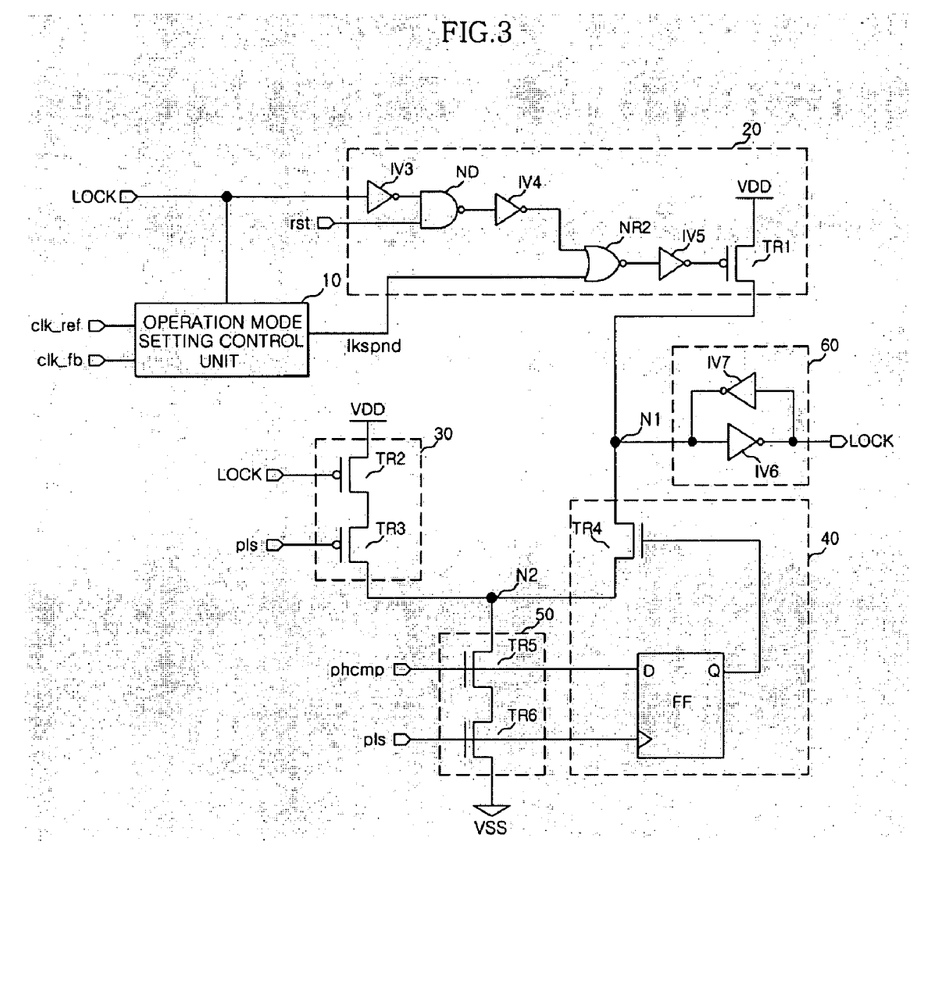
FIG. 3 is a schematic diagram showing the detailed configuration of the operation mode setting apparatus shown in FIG. 1.

FIG. 3 is a schematic diagram showing the detailed configuration of the operation mode setting apparatus 101 shown in FIG. 1. Since the detailed structure of the operation mode setting control unit 10 has been described with reference to FIG. 2, the operation mode setting control unit 10 is simply represented by a block diagram in FIG. 3.

As can be seen, the reset unit 20 can include a third inverter IV3, a fourth inverter IV4, a fifth inverter IV5, a NAND gate ND, a second NOR gate NR2, and a first transistor TR1. The third inverter IV3 can receive the locking completion signal 'LOCK'. The NAND gate ND can receive the reset signal 'rst' and an output signal of the third inverter IV3. The fourth inverter IV4 can receive an output signal of the NAND gate ND. The second NOR gate NR2 can receive an output signal of the fourth inverter IV4 and the locking suspension signal 'lkspnd'. The fifth inverter IV5 can receive an output signal of the second NOR gate NR2. The first transistor TR1 can include a gate, which receives an output signal of the fifth inverter IV5, a source supplied with an external power supply voltage VDD, and a drain coupled with the first node N1.

The power supply unit 30 can include a second transistor TR2 and a third transistor TR3. The second transistor TR2 can include a gate which receives the locking completion signal 'LOCK' and a source supplied with the external power supply voltage VDD. The third transistor TR3 can include a gate, which receives the pulse signal 'pls', a source coupled with the drain of the second transistor TR2, and a drain coupled with the second node N2.

The first control unit 40 can include a sixth inverter IV6, a flip-flop FF, and a fourth transistor TR4. The sixth inverter IV6 can receive the phase comparison signal 'phcmp'. The flip-flop FF can be configured to latch an output signal of the sixth inverter IV6 in response to the pulse signal 'pls'. The fourth transistor TR4 can include a gate, which receives an output signal of the flip-flop FF, a drain coupled with the first node N1, and a source coupled with the second node N2.

The second control unit 50 can include a fifth transistor TR5 and a sixth transistor TR6. The fifth transistor TR5 can include a gate, which receives the phase comparison signal 'phcmp' and a drain coupled with the second node N2. The sixth transistor TR6 can include a gate which receives the pulse signal 'pls', a drain coupled with the source of the fifth transistor TR5, and a source is grounded.

The latch unit 60 can include a seventh inverter IV7 and an eighth inverter IV8. The seventh inverter IV7 can be configured to receive a voltage applied at the first node N1 and to output the locking completion signal 'LOCK'. The eighth inverter IV8 forms a latch structure with the seventh inverter IV7.

Initially, the locking completion signal 'LOCK' is in a disabled state, and the locking suspension signal 'lkspnd' is in an enabled state. In this case, when the reset signal 'rst' is enabled, the reset unit 20 changes the voltage level of the first node N1 to a high level.

As described above, the pulse signal 'pls' is toggled for every predetermined period of the internal clock. When the locking completion signal 'LOCK' is disabled, the power supply unit 30 can be configured to supply a high-level voltage to the second node N2 when the pulse signal 'pls' is not toggled.

The state of the phase comparison signal 'phcmp' depends on the phases of the feedback clock 'clk_fb' and the reference clock 'clk_ref'. When the phase comparison signal 'phcmp' is at a low level, the fifth transistor TR5 of the second control unit 50 is turned off, and the voltage level of the second node N2 does not vary. Therefore, the voltage level of the first node N1 is maintained at a high level. When the pulse signal 'pls' is enabled, the flip-flop FF of the first control unit 40 outputs a high-level signal, and the fourth transistor TR4 is turned on.

Then, when the phase comparison signal 'phcmp' changes to a high level, the fifth transistor TR5 of the second control unit 50 is turned on. When the pulse signal 'pls' is enabled, the sixth transistor TR6 is turned on, and thus the voltage level of the second node N2 sinks to a low level. Since the fourth transistor TR4 is in an on state, the voltage level of the first node N1 also goes low. Therefore, the latch unit 60 enables the locking completion signal 'LOCK'.

After the locking completion signal 'LOCK' is enabled, the fourth inverter IV4 of the reset unit 20 can be configured to output a low-level signal. In this case, the locking suspension signal 'lkspnd' is enabled or disabled according to the states of the reference clock 'clk_ref' and the feedback clock 'clk_fb' that are determined by the operation mode setting control unit 10. Therefore, the level of an output signal of the fifth inverter IV5 depends on the state of the locking suspension signal 'lkspnd'. In this case, when the locking suspension signal 'lkspnd' is enabled, the reset unit 20 changes the voltage level of the first node N1 to a high level again.

Figure 4:
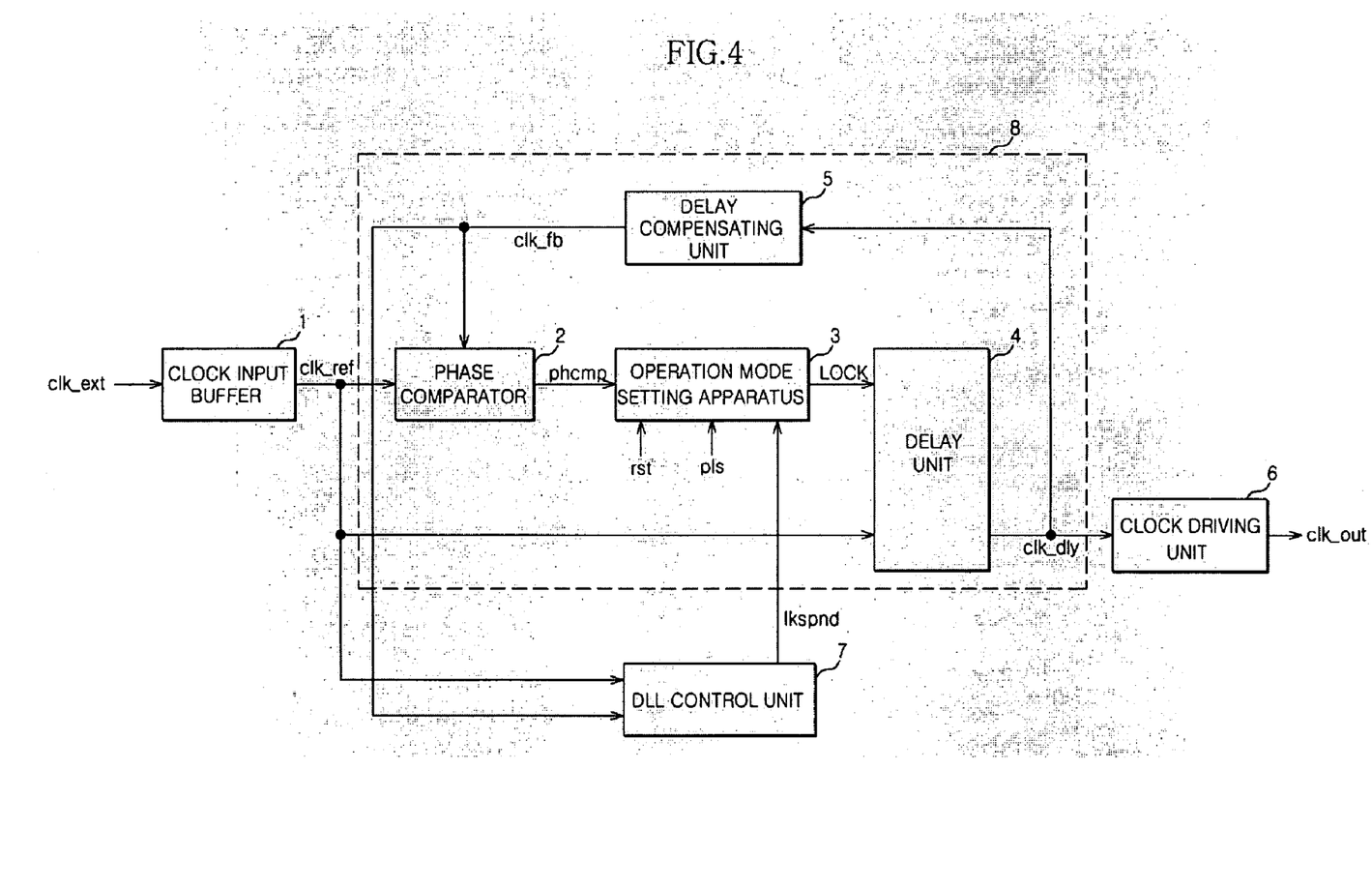
FIG. 4 is a block diagram illustrating the structure of a semiconductor integrated circuit that can include the operation mode setting apparatus of FIG. 1 according to one embodiment.

FIG. 4 is a schematic diagram showing the detailed configuration of a semiconductor integrated circuit that includes an operation mode setting apparatus 3, which can be configured to operate in a manner similar to the embodiments described above. As can be seen, the semiconductor integrated circuit can include a clock input buffer 1, a DLL circuit 8, a clock driving unit 6, and a DLL control unit 7.

The clock input buffer 1 can be configured to buffer an external clock 'clk_ext' and generates the reference clock 'clk_ref'.

The DLL circuit 8 can be configured to delay the reference clock 'clk_ref' in response to the locking completion signal 'LOCK' to generate a delay clock 'clk_dly' and the feedback clock 'clk_fb', and to generate the locking completion signal 'LOCK' in response to the reference clock 'clk_ref' and the feedback clock 'clk_fb'. The DLL circuit 8 can include a phase comparator 2, an operation mode setting apparatus 3, a delay unit 4, and a delay compensating unit 5.

The phase comparator 2 can be configured to compare the phase of the reference clock 'clk_ref' with the phase of the feedback clock 'clk_fb' and to generate the phase comparison signal 'phcmp'. The operation mode setting apparatus 3 can be configured to generate the locking completion signal in response to a reset signal 'rst', a pulse signal 'pls', the phase comparison signal 'phcmp', and the locking suspension signal 'lkspnd'. The delay unit 4 can be configured to delay the reference clock 'clk_ref', in response to the phase comparison signal 'phcmp' and the locking completion signal 'LOCK', and to generate the delay clock 'clk_dly'. The delay compensating unit 5 can be configured to delay the delay clock 'clk_dly' to generate the feedback clock 'clk_fb', in order to compensate for the delay of the delay clock 'clk_dly' as it travels to the data output buffer.

The clock driving unit 6 can be configured to drive the delay clock 'clk_dly' to generate an output clock 'clk_out'.

The DLL control unit 7 can be configured to discriminate the phase of the reference clock 'clk_ref' from the phase of the feedback clock 'clk_fb' to generate a locking suspension signal 'lkspnd' for controlling the operation mode of the DLL circuit 8. The DLL control unit 7 can have the same structure as the operation mode setting control unit 10 described above. Therefore, in this embodiment, the operation mode setting apparatus 3 does not include the operation mode setting control unit 10, and thus does not perform a function of controlling the locking completion signal 'LOCK' to be enabled or disabled according to the phases of the reference clock 'clk_ref' and the feedback clock 'clk_fb'.

In this embodiment, the operation mode setting apparatus 3 can be configured to operate when the reset signal 'rst' is enabled at the beginning of the operation of the DLL circuit 8, and to generate the locking completion signal 'LOCK' according to the voltage level of the phase comparison signal 'phcmp'. After the locking completion signal 'LOCK' is enabled, the delay unit 4 is operated in a fine locking mode to generate the delay clock 'clk_dly' from the reference clock 'clk_ref'.

When the phase difference between the reference clock 'clk_ref' and the feedback clock 'clk_fb' is larger than a predetermined amount due to an error, such as a variation in the toggle timing of the external clock 'clk_ext' that is input to the DLL circuit 8, the DLL control unit 7 can be configured to detect the phase difference and enable the locking suspension signal 'lkspnd'. Then, since the operation mode setting apparatus 3 disables the locking completion signal 'LOCK', the delay unit 4 can enter into the coarse locking mode again. When the phase difference between the reference clock 'clk_ref' and the feedback clock 'clk_fb' is smaller than the predetermined amount, the DLL control unit 7 disables the locking suspension signal 'lkspnd'. Then, the operation mode setting apparatus 3 can be configured to enable the locking completion signal 'LOCK' again, and thus the delay unit 4 can enter into the fine locking mode again.

That is, when the phase difference between the reference clock 'clk_ref' and the feedback clock 'clk_fb' is equal to or larger than a predetermined value due to an error after the delay locking operation of the DLL circuit 8 is completed, the DLL control unit 7 control the operation mode setting apparatus 3 to reset the coarse locking mode, which makes it possible to rapidly correct errors.

As described above, in a DLL circuit according to the above-described embodiments, when the phase difference between a reference clock and a feedback clock is equal to or larger than a predetermined value, even though a locking completion signal is enabled, the DLL circuit can be configured to disable a locking completion signal for resetting an operation mode. Even after the delay locking of a clock is completed, the DLL circuit can reenter into a coarse locking mode to correct a clock error, which makes it possible rapidly correct errors. That is, the operation mode setting apparatus and the semiconductor integrated circuit including the same according to the above-described embodiments of the invention has high adaptability to errors, such as a variation in the state of a clock, and it is possible to reduce errors in a clock delay locking operation of a DLL circuit and a data output operation of the semiconductor integrated circuit.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An operation mode setting apparatus, comprising:
   an operation mode setting control unit configured to discriminate the phase of a reference clock from the phase of a feedback clock to generate a locking suspension signal; and
   an operation mode setting unit configured to generate a locking completion signal in response to a phase comparison signal and a pulse signal under the control of a reset signal and the locking suspension signal,
   wherein the operation mode setting control unit includes:
      a latch configured to latch the locking completion signal and generate an output;
      a first detector configured to detect whether the phase of the feedback clock leads the phase of the reference clock by a first time, and to generate a first detection signal;
      a second detector configured to detect whether the phase of the reference clock leads the phase of the feedback clock by a second time, and to generate a second detection signal; and
      a signal combining unit configured to combine an output signal of the latch, the first detection signal, and the second detection signal to generate the locking suspension signal.

2. The operation mode setting apparatus of claim 1, wherein the operation mode setting control unit is configured to enable the locking suspension signal, when the phase difference between the reference clock and the feedback clock is equal to or larger than a predetermined time.

3. The operation mode setting apparatus of claim 2, wherein the operation mode setting control unit is configured to enable the locking suspension signal when the locking completion signal is enabled, the phase of the feedback clock leads the phase of the reference clock by the first time, or the phase of the reference clock leads the phase of the feedback clock by the second time.

4. The operation mode setting apparatus of claim 1, wherein the operation mode setting unit includes:
   a reset unit configured to control whether to enable the locking completion signal in response to the reset signal and the locking suspension signal; and
   a locking completion signal generator configured to generate the locking completion signal in response to the phase comparison signal and the pulse signal under the control of the reset unit.

5. The operation mode setting apparatus of claim 4, wherein the reset unit is configured to supply voltage to a first node to which a voltage for generating the locking completion signal is applied when the locking completion signal is disabled and then the reset signal is enabled, or when the locking completion signal is enabled and then the locking suspension signal is enabled.

6. The operation mode setting apparatus of claim 5, wherein the locking completion signal generator includes:
   a power supply unit configured to supply voltage to a second node in response to the locking completion signal and the pulse signal;
   a first control unit configured to control the voltage level of the first node in response to the phase comparison signal and the pulse signal;
   a second control unit configured to control the voltage level of the second node in response to the phase comparison signal and the pulse signal; and
   a latch unit configured to latch the voltage applied at the first node and output the locking completion signal.

7. The operation mode setting apparatus of claim 6, wherein the power supply unit is configured to supply a voltage having a first level to the second node when the locking completion signal is disabled and then the pulse signal is enabled.

8. The operation mode setting apparatus of claim 6, wherein the first control unit includes a flip-flop configured to latch the phase comparison signal when the pulse signal is enabled, and to connect the first node and the second node.

9. The operation mode setting apparatus of claim 7, wherein the second control unit is configured to supply a voltage having a second level to the second node, when the phase comparison signal and the pulse signal have the first levels.

10. A semiconductor integrated circuit, comprising:
    a DLL (delay locked loop) circuit configured to delay a reference clock in response to a locking completion signal to generate a delay clock and a feedback clock, and to generate the locking completion signal in response to the reference clock and the feedback clock; and
    a DLL control unit configured to discriminate the phase of the reference clock from the phase of the feedback clock to control the operation mode of the DLL circuit,
    wherein the DLL control unit includes:
       a latch is configured to latch the locking completion signal and generate an output;
       a first detector configured to detect whether the phase of the feedback clock leads the phase of the reference clock by a first time, and to generate a first detection signal;
       a second detector configured to detect whether the phase of the reference clock leads the phase of the feedback clock by a second time, and to generate a second detection signal; and
       a signal combining unit configured to combine an output signal of the latch, the first detection signal, and the second detection signal to generate the locking suspension signal.

11. The semiconductor integrated circuit of claim 10, wherein the DLL control unit is configured to enable a locking suspension signal when the phase difference between the reference clock and the feedback clock is equal to or larger than a predetermined time.

12. The semiconductor integrated circuit of claim 11, wherein the DLL control unit is configured to enable the locking suspension signal when the locking completion signal is enabled, the phase of the feedback clock leads the phase of the reference clock by the first time, or the phase of the reference clock leads the phase of the feedback clock by the second time.

13. The semiconductor integrated circuit of claim 11, wherein the DLL circuit includes:
    a phase comparator configured to compare the phase of the reference clock with the phase of the feedback clock and to generate a phase comparison signal;
    an operation mode setting apparatus configured to generate a locking completion signal in response to a reset signal, the phase comparison signal, and the locking suspension signal;
    a delay unit configured to delay the reference clock to generate the delay clock in response to the phase comparison signal and the locking completion signal; and
    a delay compensating unit configured to delay the delay clock to generate the feedback clock in order to compensate for the delay of the delay clock as it travels to a data output buffer.

14. The semiconductor integrated circuit of claim 13, wherein the operation mode setting apparatus is configured to control the state of the locking completion signal in response to the phase comparison signal after the reset signal is enabled when the locking completion signal is disabled, and resets the state of the locking completion signal in response to the phase comparison signal according to whether the locking suspension signal is enabled when the locking completion signal is enabled.

15. The semiconductor integrated circuit of claim 13, wherein the operation mode setting apparatus includes:
    a reset unit configured to control the voltage level of a first node in response to the locking suspension signal, the reset signal, and the locking completion signal;
    a power supply unit configured to supply voltage to a second node in response to the locking completion signal and a pulse signal;
    a first control unit configured to control the voltage level of the first node in response to the phase comparison signal and the pulse signal;
    a second control unit configured to control the voltage level of the second node in response to the phase comparison signal and the pulse signal; and
    a latch unit configured to latch the voltage level applied at the first node and outputs the locking completion signal.

16. The semiconductor integrated circuit of claim 15, wherein the reset unit is configured to supply voltage to the first node when the locking completion signal is disabled and then the reset signal is enabled, or when the locking completion signal is enabled and then the locking suspension signal is enabled.

17. The semiconductor integrated circuit of claim 13, wherein the delay unit is configured to operate in a fine locking mode when the locking completion signal is enabled, and operate in a coarse locking mode when the locking completion signal is disabled again.

18. A method of controlling a semiconductor integrated circuit, comprising:
    disabling a locking completion signal to perform a coarse locking operation on a reference clock, thereby generating a delay clock and a feedback clock;
    enabling the locking completion signal to perform a fine locking operation on the reference clock, thereby generating the delay clock and the feedback clock; and
    discriminating the phase of the reference clock from the phase of the feedback clock and re-determining whether to enable the locking completion signal on the basis of the result of the discrimination, wherein the enabling of the locking suspension signal includes:

latching the locking completion signal;

detecting whether the phase of the feedback clock leads the phase of the reference clock by a first time, and generating a first detection signal;

detecting whether the phase of the reference clock leads the phase of the feedback clock by a second time, and generating a second detection signal; and combining the latched locking completion signal, the first detection signal, and the second detection signal to generate the locking suspension signal.

19. The method of claim 18, wherein the performing of the coarse locking operation includes:

comparing the phase of the reference clock with the phase of the feedback clock and disabling the locking completion signal;

delaying the reference clock in response to the locking completion signal to generate the delay clock; and delaying the delay clock to generate the feedback clock in order to compensate for the delay amount of the delay clock on a traveling path to a data output buffer.

20. The method of claim 18, wherein the performing of the fine locking operation includes:

comparing the phase of the reference clock with the phase of the feedback clock and enabling the locking completion signal;

delaying the reference clock in response to the locking completion signal to generate the delay clock; and delaying the delay clock to generate the feedback clock in order to compensate for the delay amount of the delay clock on a traveling path to a data output buffer.

21. The method of claim 18, wherein the re-determining of whether to enable the locking completion signal includes:

when the phase difference between the reference clock and the feedback clock is equal to or larger than a predetermined time, enabling a locking suspension signal; and initializing the state of the locking completion signal in response to the locking suspension signal.

* * * * *